(12) United States Patent
Ishige

(10) Patent No.: US 6,316,314 B1
(45) Date of Patent: Nov. 13, 2001

(54) NONVOLATILE SEMICONDUCTOR MEMORY DEVICE AND FABRICATION METHOD

(75) Inventor: Kiyokazu Ishige, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/458,994

(22) Filed: Dec. 10, 1999

(30) Foreign Application Priority Data

Jan. 26, 1999 (JP) ................................................. 11-016612

(51) Int. Cl.[7] .............................................. H01L 21/8247
(52) U.S. Cl. ........................................................... 438/258
(58) Field of Search .................................... 438/257–267

(56) References Cited

U.S. PATENT DOCUMENTS

| | | | |
|---|---|---|---|
| 5,538,912 | * | 7/1996 | Kunori et al. . |
| 5,789,293 | * | 8/1998 | Cho et al. ............................. 438/257 |
| 5,792,696 | * | 8/1998 | Kim et al. ............................ 438/258 |
| 5,908,311 | * | 6/1999 | Chi et al. ............................. 438/258 |
| 5,950,086 | * | 9/1999 | Takahashhi et al. ................. 438/258 |
| 6,020,229 | * | 2/2000 | Yamane et al. ...................... 438/201 |

FOREIGN PATENT DOCUMENTS 6-151580   5/1994   (JP) .

* cited by examiner

Primary Examiner—Richard Booth
(74) Attorney, Agent, or Firm—Young & Thompson

(57) ABSTRACT

A nonvolatile semiconductor memory device and a method of fabricating the device are provided that allow the use of dry etching when removing the ONO film and that eliminate the danger of etching the silicon substrate in the gate oxide film formation areas even in the event of over-etching. In the process of fabricating a nonvolatile semiconductor memory device that is provided with a memory cell area including nonvolatile memory and a peripheral circuit area including circuits for controlling the nonvolatile memory, an insulative material that is to become an insulating film overlying floating gate electrodes is formed over the entire surface of each area and over a first conductive layer in the peripheral circuit area, and a dummy pattern is provided in the boundary areas between the memory cell area and peripheral circuit area so as to surround the memory cell area, this dummy pattern being composed of: a first conductive material that constitutes the floating gate electrodes of the nonvolatile memory, a second conductive material that constitutes the control gate electrodes of the nonvolatile memory, and an ONO film that constitutes an insulating film between the floating gate electrodes and the control gate electrodes.

8 Claims, 10 Drawing Sheets

NONVOLATILE SEMICONDUCTOR MEMORY DEVICE AND FABRICATION METHOD

BACKGROUND OF THE INVENTION

1. Field of the Invention

The present invention relates to a nonvolatile semiconductor memory device and a method of fabricating such a device, and particularly to a nonvolatile semiconductor memory device in which a dummy pattern is formed in a boundary area between a memory cell area and a peripheral circuit area, and a method of fabricating such a device.

2. Description of the Related Art

A nonvolatile memory having a floating gate comprises a memory cell area, a peripheral circuit area containing transistors, and a boundary area that forms the boundary between the memory cell area and the peripheral circuit area.

In the prior art, such a nonvolatile memory was fabricated by processes such as shown in FIGS. 1–8. The fabrication method of the prior art is disclosed in Japanese Patent Laid-open No. 151580/94.

In this fabrication method, as shown in FIG. 1, element isolating area 14 and gate insulating film 12 are first formed on, for example, p-type silicon substrate 10. Polysilicon 16 is next formed over the entire surface, and polysilicon 16 of the memory cell area is then patterned using resist pattern 18 to form floating gate electrodes 20. At this time, the polysilicon of the peripheral circuit area is not removed and remains so as to prevent implantation of ions into the peripheral circuit area when ions for channel stopping are implanted in the next process.

Next, as shown in FIG. 2, ions are implanted for a channel stopper. In this case, silicon substrate 10 is p-type, and boron (B) ions, which can form a p-type area, are therefore implanted. The purpose of this ion implantation is as follows:

The width of element isolating areas 14 that are to be formed between floating gate electrodes shrinks with the miniaturization of memory cells. A decrease in the width of element isolating area 14 means that the element isolating areas are also thinner than in a case in which element isolating areas are sufficiently large, and this leads to a drop in element isolating capability and the occurrence of adverse effects such as the flow of current between adjacent channels. To prevent such adverse effects, a channel stopper, which is a p-type area of higher concentration than silicon substrate 10, is formed inside and on the lower surface of element isolating areas.

After removing resist pattern 18, resist pattern 22 is provided on the memory cell area and polysilicon 16 of the peripheral circuit area is removed by dry etching, as shown in FIG. 3. At this time, gate insulating film 12 below polysilicon 16 is also partially removed.

Next, resist pattern 22 is removed, and after removing gate insulating film 12 of the peripheral circuit area by wet etching, an ONO film (a three-layer structure of silicon oxide film-silicon nitride film-silicon oxide film) is formed over the entire surface as shown in FIG. 4. This ONO film 24 is an insulating film for preventing the loss of the charge held by floating gate electrodes 20. Although this ONO film 24 has ideal functions if formed as a film above floating gate electrodes 20, it is not appropriate as a gate insulating film of transistors of the peripheral circuit area, and ONO film 24 of the peripheral circuit area is therefore eliminated using resist pattern 25 as shown in FIG. 5. Methods of removing the ONO film include dry etching and wet etching.

Next, as shown in FIG. 6, gate oxidation is carried out and gate insulating film 26 is formed in the peripheral circuit area.

Polysilicon 30 is next formed over the entire surface as shown in FIG. 7, and control gate electrodes 30 are patterned in the memory cell area using resist pattern 28. The removal of polysilicon 30 by patterning also encroaches into element isolating area 14 below polysilicon 30 in area 38.

Finally, resist pattern 28 is eliminated, and, as shown in FIG. 8, the polysilicon of the peripheral circuit area is patterned using resist pattern 32 to form gate electrodes 34. At this time, resist pattern 32 is formed to cover area 38 so that the film thickness of element isolating area 14 below area 38 is not etched and diminished as an element isolation film. As a result, dummy pattern 36 composed of polysilicon is left in the boundary area between the memory cell area and the peripheral circuit area. This dummy pattern 36 surrounds the memory cell area and connects to ground when the memory cell is used.

The dry etching or wet etching that is used when removing the ONO film from the peripheral circuit area in the prior-art fabrication method described hereinabove has the following problems:

When dry etching is used, there is the disadvantage that over-etching may encroach into the silicon substrate in the formation area of the gate insulating film. This problem occurs because the etching rate of nitride film and the etching rate of oxide film in the ONO film are substantially equal, and it is therefore difficult to carry out etching such that only the oxide film of the gate insulating film formation area remains. Etching into the silicon substrate in the formation area of the gate insulating film causes problems such as deterioration of the withstand voltage of the gates, leakage of current at the field end, and a decrease in the ON current of transistors.

In the case of wet etching, the use of nitride film etching liquid can introduce a difference between the etching rate of the nitride film and the etching rate of the oxide film, but an oxide film must be formed as a mask instead of a resist because a resist cannot serve as a mask against the wet etching liquid of the nitride film. When this oxide film for masking is removed, however, there is the problem that the uppermost oxide film layer of the ONO film in the memory cell area is also removed.

Removal of the uppermost oxide layer of the ONO film in the memory cell area causes such problems as variation in the nonvolatile memory operating properties and a reduction in the product yield.

SUMMARY OF THE INVENTION

It is an object of the present invention to provide a construction of a nonvolatile semiconductor memory device that does not cause the above-described problems during fabrication and a method of fabricating a nonvolatile semiconductor memory device of this construction.

The nonvolatile semiconductor memory device of this invention is provided with: a memory cell area including nonvolatile memory, a peripheral circuit area including circuits for controlling this nonvolatile memory, and dummy pattern provided in the boundary area between the memory cell area and the peripheral circuit area.

In the first embodiment, this dummy pattern is made up of: a conductive material that constitutes the control gate electrodes of the nonvolatile memory, and residue of an insulative material that constitutes an insulating film between the floating gate electrodes and control gate electrodes that remain without being removed in the fabrication process; this residue being covered by the conductive material.

In the second embodiment, the dummy pattern is made up of: a first conductive material that constitutes the floating gate electrodes of the nonvolatile memory, a second conductive material that constitutes the control gate electrodes of the nonvolatile memory, and an insulative material that makes up the insulating film between the floating gate electrodes and the control gate electrodes.

The method of fabricating the nonvolatile semiconductor memory device of this invention is a method of fabricating a nonvolatile semiconductor memory device provided with: a memory cell area including nonvolatile memory, a peripheral circuit area including circuits for controlling this nonvolatile memory, and a dummy pattern provided in the boundary area between the memory cell area and the peripheral circuit area.

The first embodiment of the fabrication method includes a step of providing, in a boundary area between the memory cell area and peripheral circuit area, a dummy pattern that is made up of: residue that is the insulative material that constitutes the insulating film between the floating gate electrodes and the control gate electrodes of the nonvolatile memory that remains without being eliminated in the fabrication process, and a conductive material that constitutes the floating gate electrodes of the nonvolatile memory that covers this residue.

The second embodiment of the fabrication method includes a step of providing, in a boundary area between the memory cell area and the peripheral circuit area, a dummy pattern that is made up of: a first conductive material that constitutes the floating gate electrodes of the nonvolatile memory, a second conductive material that constitutes the control gate electrodes of the nonvolatile memory, and an insulative material that constitutes the insulating film between the floating gate electrodes and the control gate electrodes.

The above and other objects, features, and advantages of the present invention will become apparent from the following descriptions based on the accompanying drawings which illustrate examples of preferred embodiments of the present invention.

DETAILED DESCRIPTION OF THE PREFERRED EMBODIMENTS

The best modes of embodiments of the present invention are next explained based on the first and second embodiments.

Figure 1:
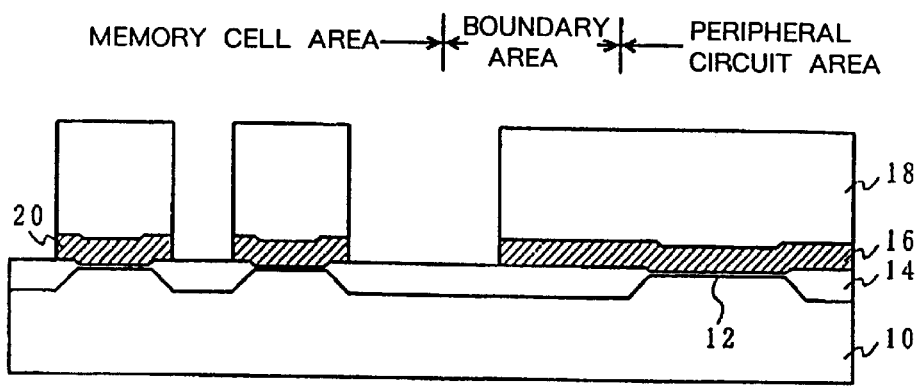
FIGS. 1–8 are partial sectional views showing each fabrication step of a nonvolatile semiconductor memory device of the prior art.
Figure 2:
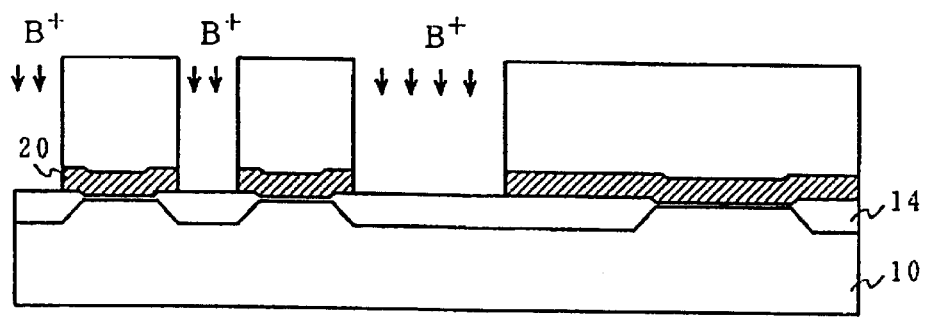
Figure 3:
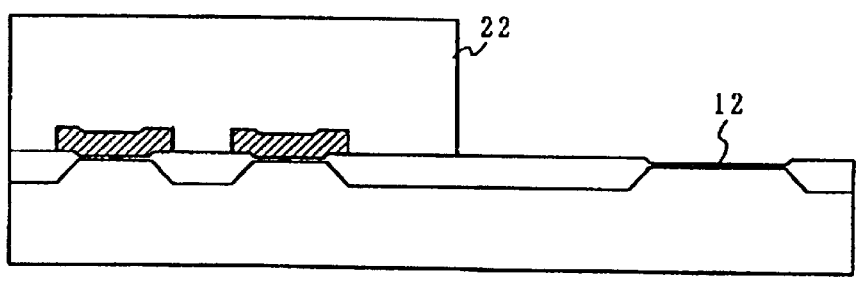
Figure 4:
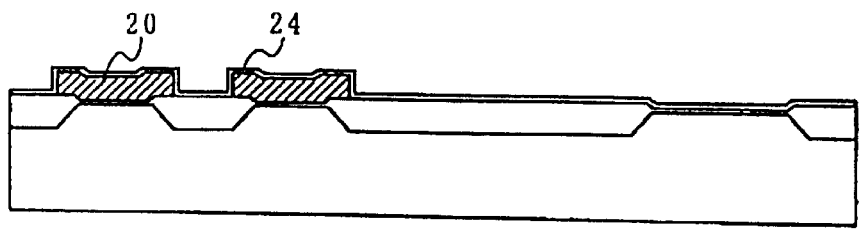
Figure 5:
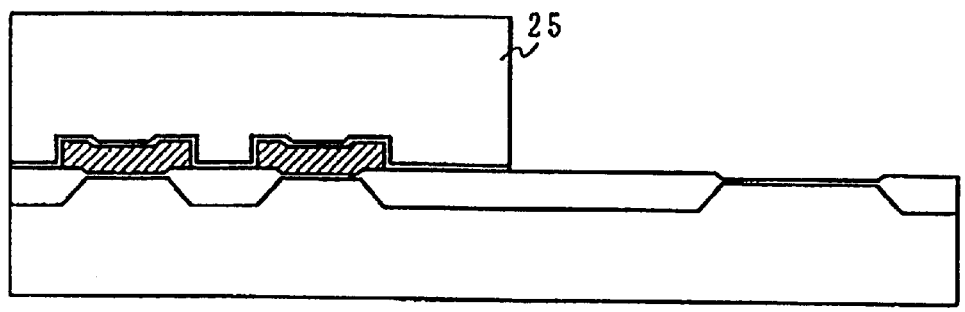
Figure 6:
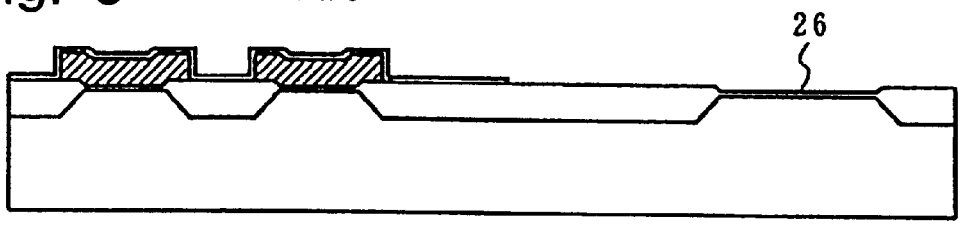
Figure 7:
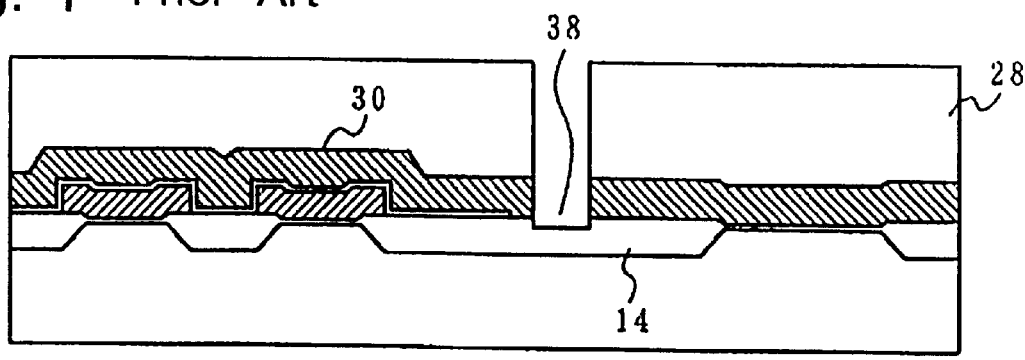
Figure 8:
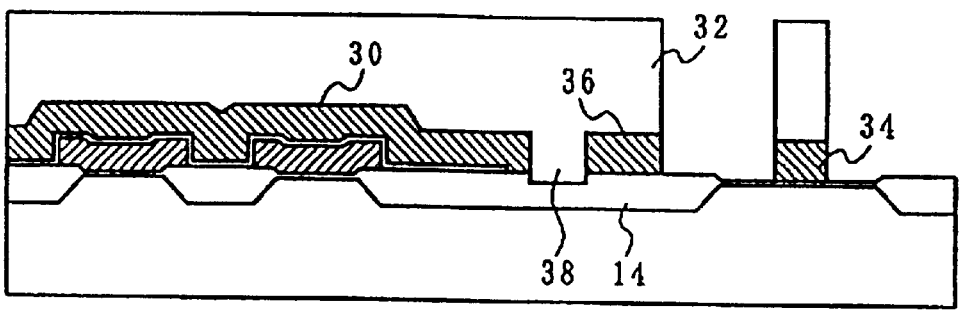
Figure 9:
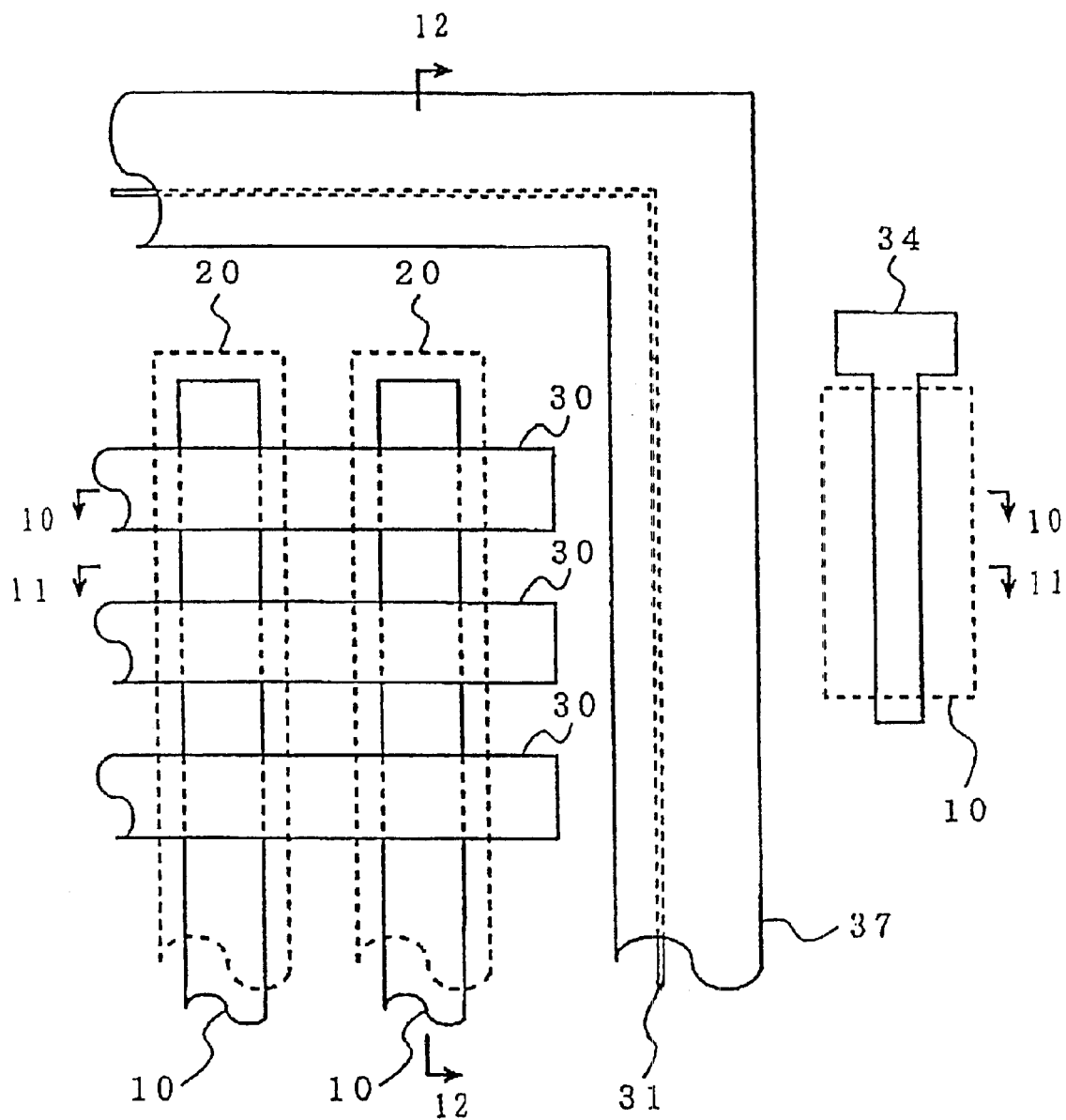
FIG. 9 is a partial plan view of the nonvolatile semiconductor memory device according to the first embodiment of the present invention.

Explanation is presented regarding both the fabrication method and structure of the nonvolatile semiconductor memory device of the first embodiment of the present invention, a partial plan view of which is shown in FIG. 9.

Figure 10A:
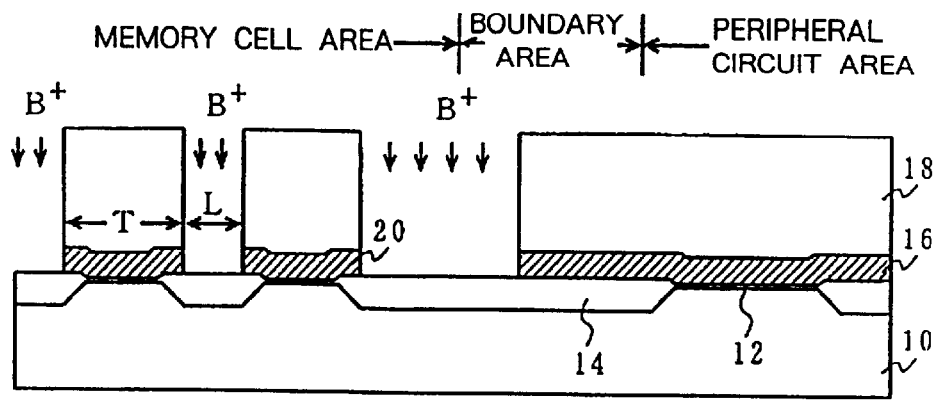
FIGS. 10A–10D are partial sectional views taken at line 10—10 of FIG. 9 of the nonvolatile semiconductor memory device in each fabrication step of the first embodiment.
Figure 11A:
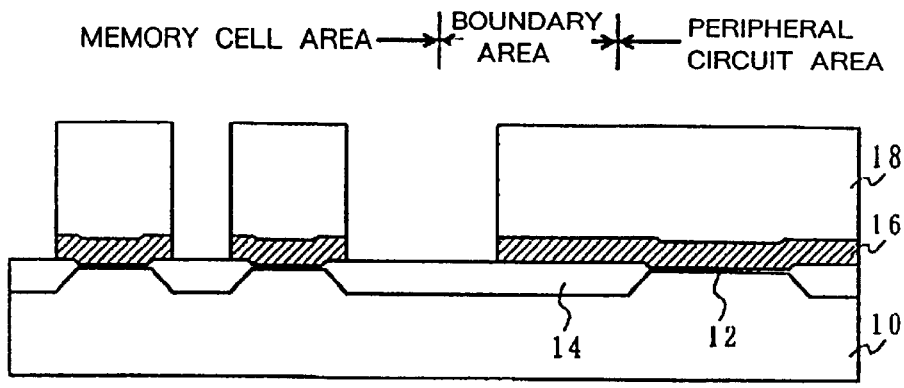
FIGS. 11A–11D are partial sectional views taken at line 11—11 of FIG. 9 of the nonvolatile semiconductor memory device in each fabrication step of the first embodiment.
Figure 12A:
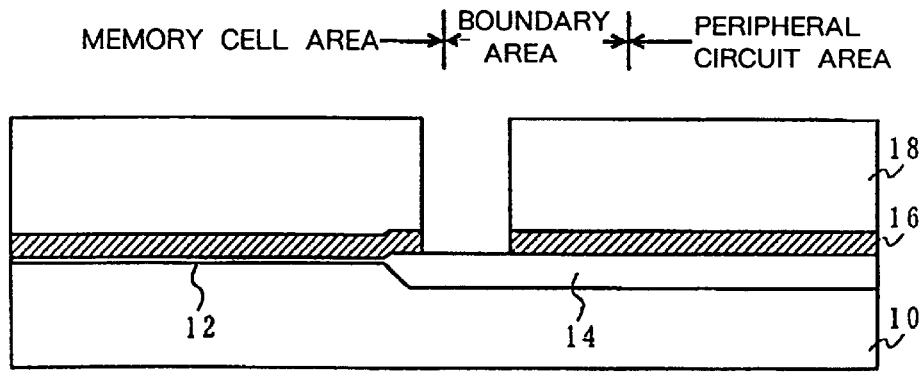
FIGS. 12A–12D are partial sectional views taken at line 12—12 of FIG. 9 of the nonvolatile semiconductor memory device in each fabrication step of the first embodiment.

As shown in FIG. 10A, FIG. 11A, and FIG. 12A, on a p-type semiconductor substrate such as p-type silicon substrate 10, an oxide film (not shown in the figure) is formed to a thickness of 30–200 Å and a field nitride film (not shown) is formed to a thickness of 1000–2000 Å, following which portions other than the element area are patterned, whereby element isolating area 14 composed of a $SiO_2$ film is formed by forming a field insulating film ($SiO_2$). In addition, gate insulating film 12 is formed to a thickness of 50–150 Å by a thermal oxidation method in element areas other than element isolating area 14.

Next, polysilicon containing impurities such as phosphorus is formed over the entire surface to a thickness of 500–1500 Å, and the memory cell area alone is patterned using resist pattern 18 to form floating gate electrodes 20.

Width T of floating gate electrode 20 shown in FIG. 10A is, for example, 0.3–0.6 μm, and distance L between electrodes is, for example, 0.15–0.4 μm.

When polysilicon 16 is patterned, polysilicon 16 outside the memory cell area is not removed and is left so as to prevent implantation of ions in these areas when ions for use as a channel stopper are implanted in the next process. The channel stopper ions are then implanted. In this case, silicon substrate 10 is p-type, and boron (B) ions that can form a p-type area therefore are implanted to form p-type areas having a still higher concentration than silicon substrate 10 in the interior and lower portion of element isolating area 14, these areas serving as channel stoppers.

Figure 10B:
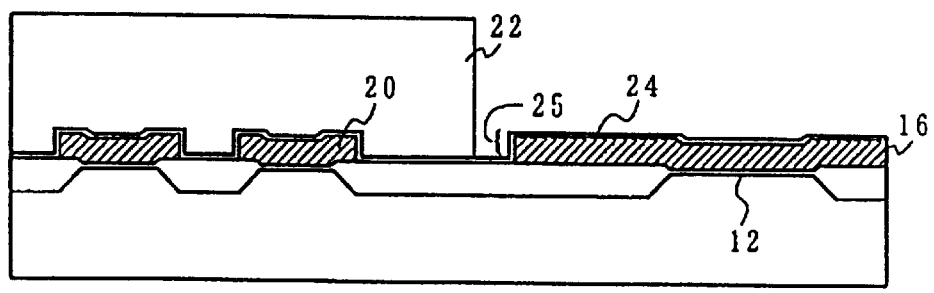
Figure 11B:
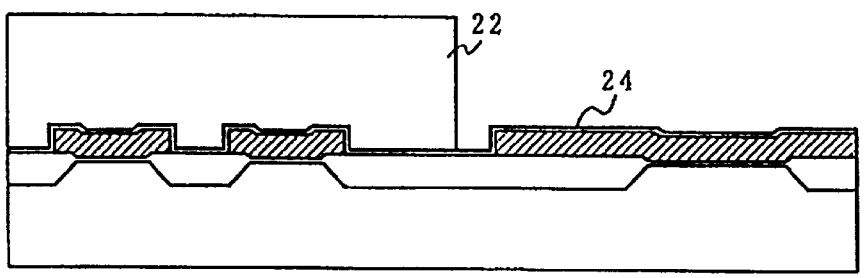
Figure 12B:
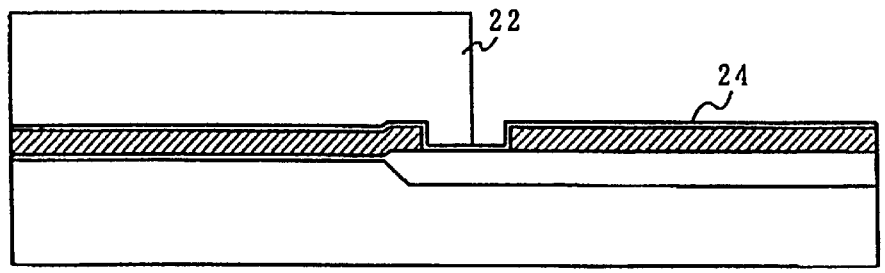

After resist pattern 18 is removed, insulating film 24 made up of ONO (silicon oxide film—silicon nitride film—silicon oxide film) is formed over the entire surface to a thickness of 100–200 Å by thermal oxidation or chemical vapor deposition as shown in FIG. 10B, FIG. 11B, and FIG. 12B, following which ONO film 24 in areas other than the memory cell area is removed by dry etching using resist pattern 22 formed in the memory cell area.

ONO film 24 is removed with polysilicon 16 underlying the film, thereby avoiding the problem described in the above-described method of the prior art in which the silicon substrate in the gate insulating film formation areas is reduced during ONO film removal. As a result, the ONO film can be removed by dry etching.

When ONO film 24 is removed in this way, ONO film 25 formed in the side walls of polysilicon 16 in the boundary area has a height, and as a result, the ONO film is not entirely removed by dry etching and remains in the side wall portions. Next, polysilicon 16 in areas other than the memory cell area is removed by dry etching. A portion of gate insulating film 12 is also removed at this time, planing down this surface and rendering gate insulating film 12 unusable as a gate insulating film. This gate insulating film 12 is therefore removed by wet etching, and gate insulating film 13 is newly formed to a thickness of 50–200 Å.

Figure 10C:
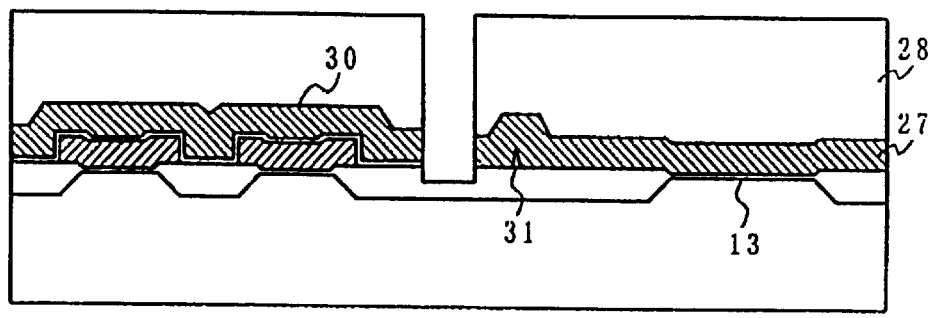
Figure 11C:
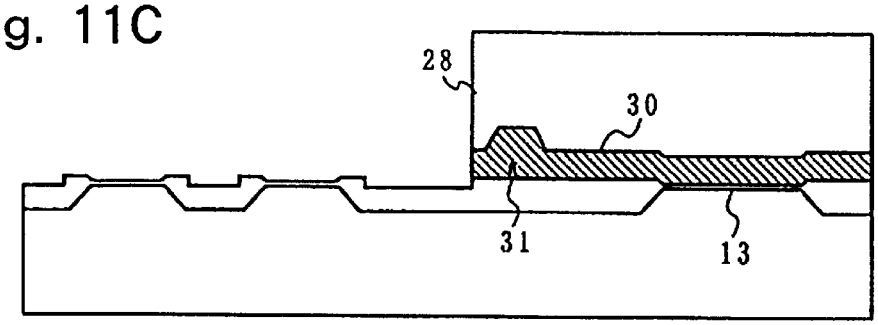
Figure 12C:
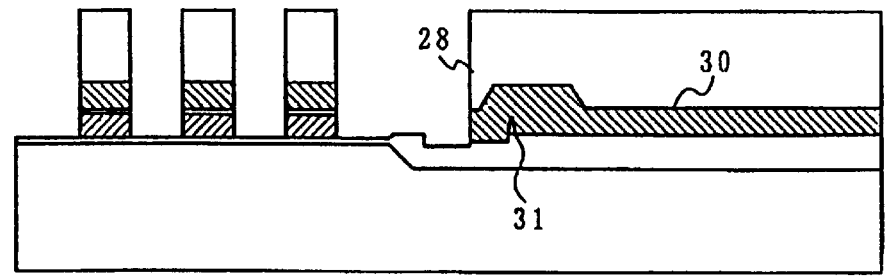

Next, after removing resist pattern 22, control gate electrodes 30 are formed by forming over the entire surface film 27 of a two-layer structure made up of a lower layer of polysilicon containing impurities such as phosphorus and having a thickness of 500–1500 Å and an upper layer of a refractory metal silicide having a thickness of 500–1500 Å, and then patterning only the memory cell area using resist pattern 28, as shown in FIG. 10C, FIG. 11C, and FIG. 12C. As shown in each figure, ONO film 31 that remains in the side wall portion as a thin wedge shape in cross-section after wet etching is buried in film 27 of two-layer structure composed of a lower layer of polysilicon and an upper layer of a high refractory metal silicide.

Figure 10D:
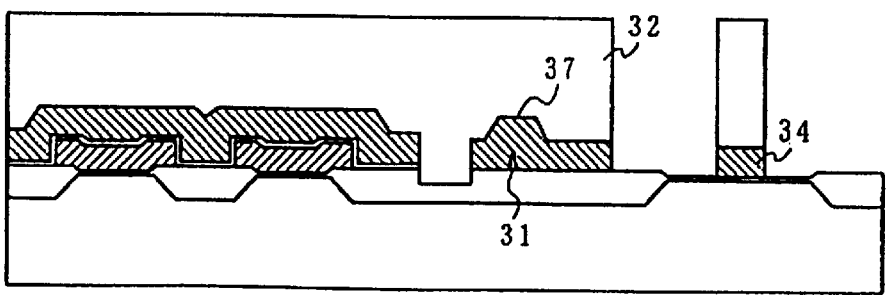
Figure 11D:
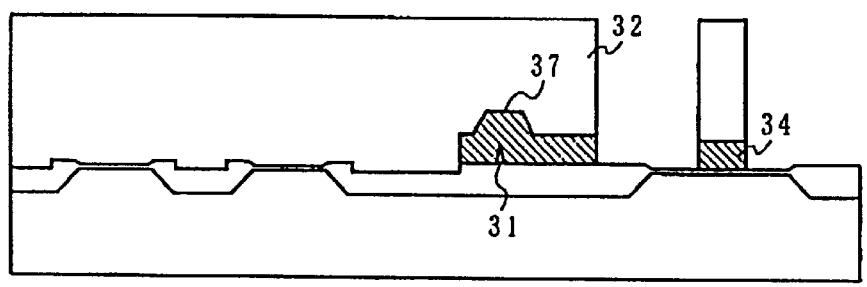
Figure 12D:
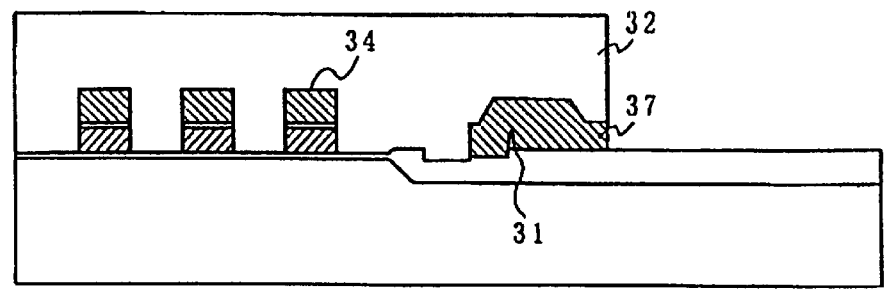

Next, after removing resist pattern 28, resist pattern 32 is formed, and film 27, which is of a two-layer structure composed of a lower layer of polysilicon and an upper layer of refractory metal silicide, that remains in the peripheral circuit area is patterned to form gate electrodes 34, and dummy pattern 37 in the boundary area is simultaneously patterned to surround the memory cell area, as shown in FIG. 10D, FIG. 11D, and FIG. 12D. As shown in the figures, remaining ONO film 31 is buried inside dummy pattern 37, and this dummy pattern 37 is connected to GND when the memory device is used.

In this embodiment, remaining ONO film 31 that is not eliminated by etching is buried inside dummy pattern 37, but there is a danger of manufacturing defective products if this remaining ONO film 31 should peel off during the wet etching of gate insulating film 12, remain suspended in the etching solution as residue, and then adhere to an element.

In the next embodiment, a fabrication method is disclosed in which this type of problem does not occur.

Figure 13:
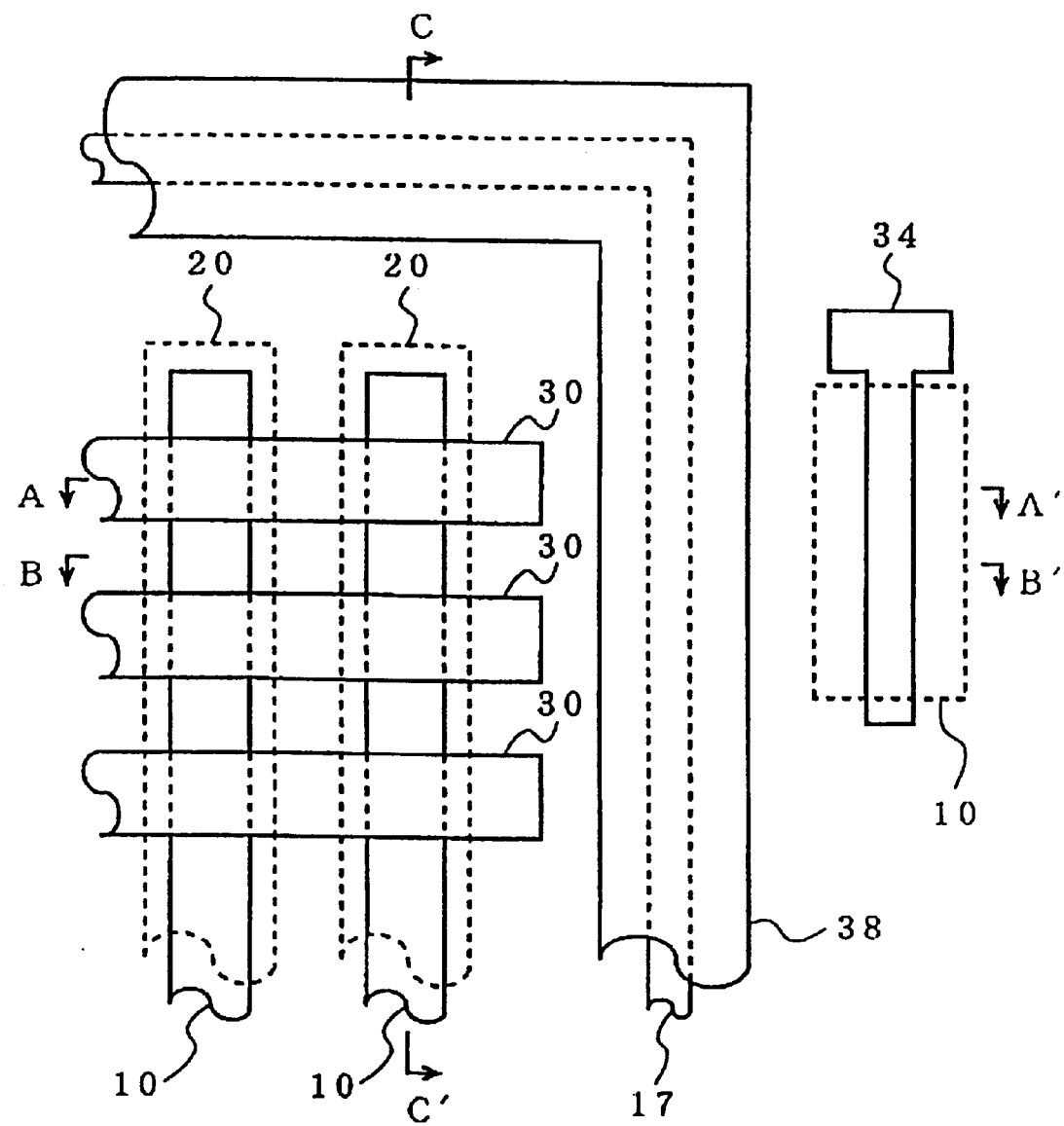
FIG. 13 is a partial plan view of the nonvolatile semiconductor memory device according to the second embodiment of the present invention.

Explanation is next presented regarding both the structure and method of fabrication of the nonvolatile semiconductor memory device of the second embodiment of the present invention, a partial plan view of which is shown in FIG. 13.

Figure 14A:
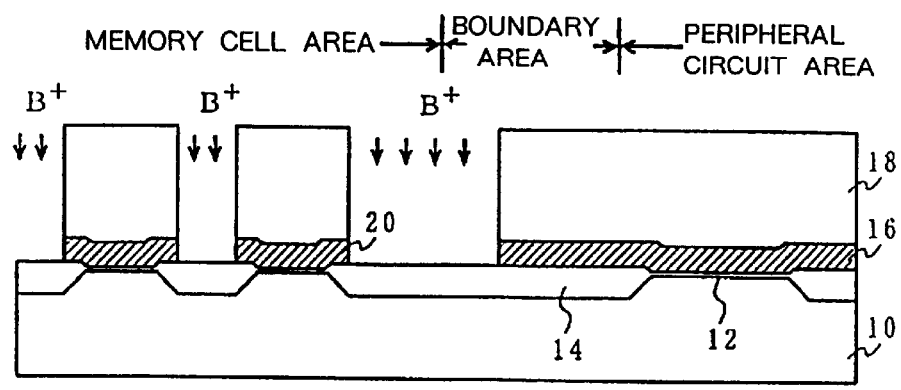
FIGS. 14A–14D are partial sectional views taken at line 14—14 of FIG. 13 of the nonvolatile semiconductor memory device in each fabrication step of the second embodiment.
Figure 15A:
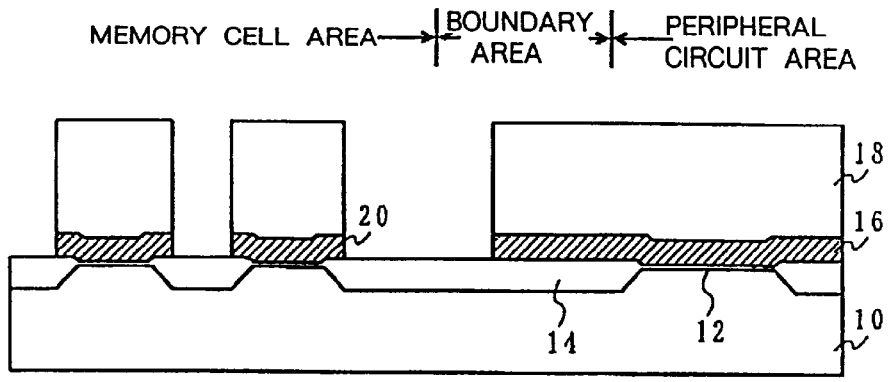
FIGS. 15A–15D are partial sectional views taken at line 15—15 of FIG. 13 of the nonvolatile semiconductor memory device in each fabrication step of the second embodiment.
Figure 16A:
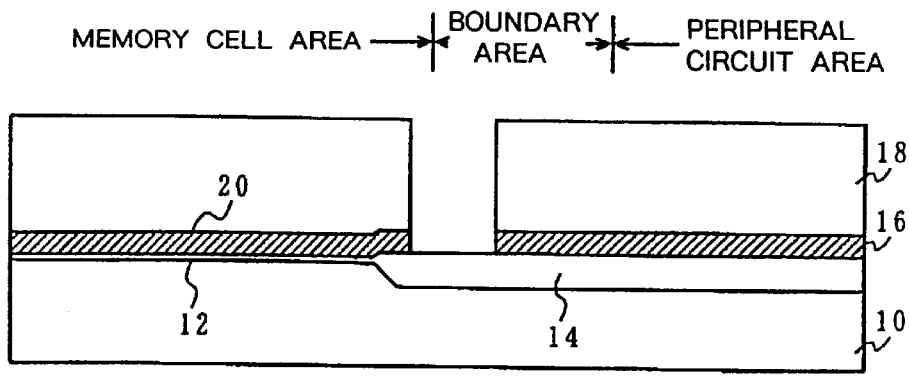
FIGS. 16A–16D are partial sectional views taken at line 16—16 of FIG. 13 of the nonvolatile semiconductor memory device in each fabrication step of the second embodiment.

First, as shown in FIG. 14A, FIG. 15A, and FIG. 16A, an oxide film (not shown in the figures) is formed on p-type silicon substrate 10 to a thickness of 30–200 Å and a field nitride film (not shown) is formed to a thickness of 1000–2000 Å, following which portions other than the element area are patterned and element isolating area 14 composed of a $SiO_2$ film is formed by forming a field insulating film ($SiO_2$ film). Gate insulating film 12 is then formed to a thickness of 50–150 Å by thermal oxidation on element areas other than element isolating area 14.

Next, floating gate electrodes 20 are formed by forming polysilicon 16 containing phosphorus to a thickness of 500–1500 Å over the entire surface and patterning only the memory cell area of polysilicon 16 using resist pattern 18. At this time, polysilicon 16 of the peripheral circuit area is not removed and remains. Next, ions are implanted for use as a channel stopper. Since silicon substrate 10 is p-type in this case, boron (B) ions that can form a p-type area are implanted to form a p-type area having a higher concentration than silicon substrate 10 inside and on the bottom of element isolating area 14, and this area becomes a channel stopper. The above-described processes are the same as in the first embodiment.

Figure 14B:
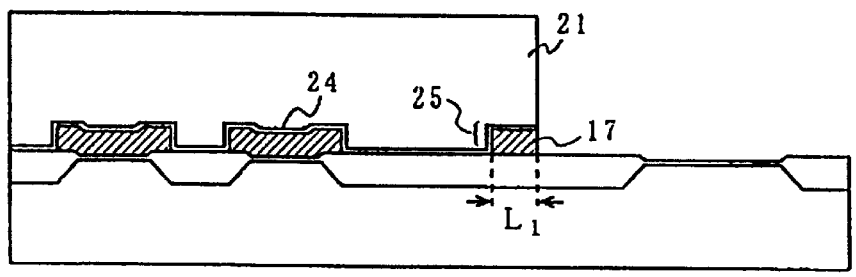
Figure 15B:
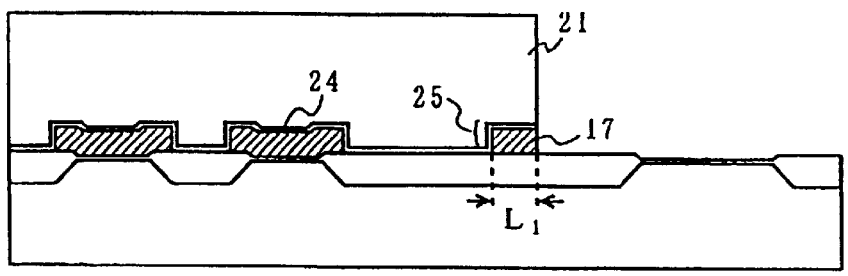
Figure 16B:
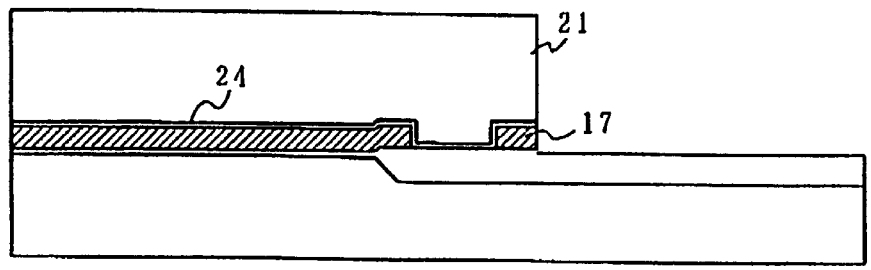

Resist pattern 18 is then eliminated, and as shown in FIG. 14B, FIG. 15B, and FIG. 16B, ONO insulating film 24 is formed to a thickness of 100–200 Å by thermal oxidation or chemical vapor deposition. ONO film 24 and polysilicon 16 of a portion of the boundary area and the peripheral circuit area are then removed by dry etching using resist pattern 21 formed on a portion of the boundary and memory cell area, following which gate insulating film 12 is removed by wet etching. Resist pattern 21 is formed so as to cover a portion of polysilicon 17, which is a portion of polysilicon 16, ONO film 25 having been formed above and on the side walls of polysilicon 16 as shown in the figures. Accordingly, polysilicon 17 having ONO film 24 above as well as on the side walls remains in the boundary area. The width $L_1$ of this polysilicon 17 is, for example, 0.3–0.6 μm.

Figure 14C:
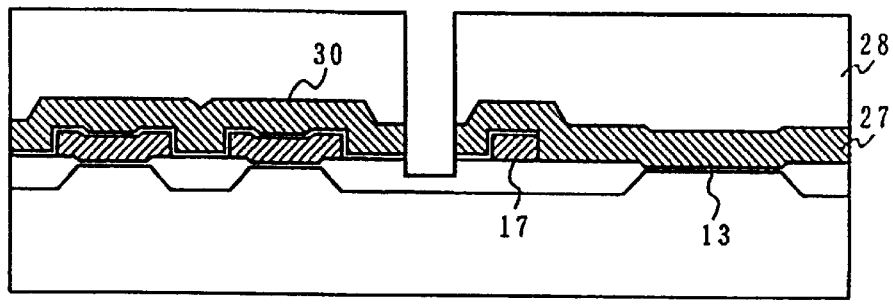
Figure 15C:
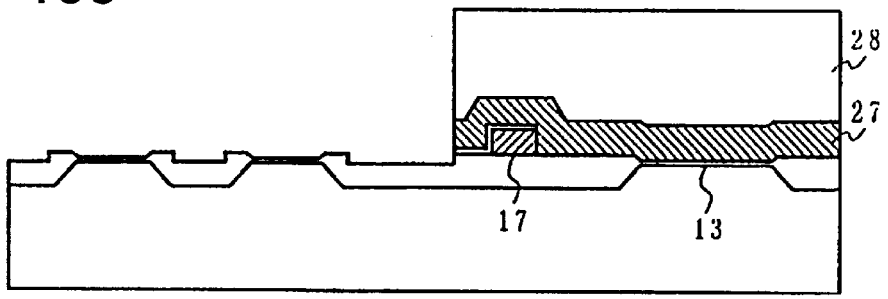
Figure 16C:
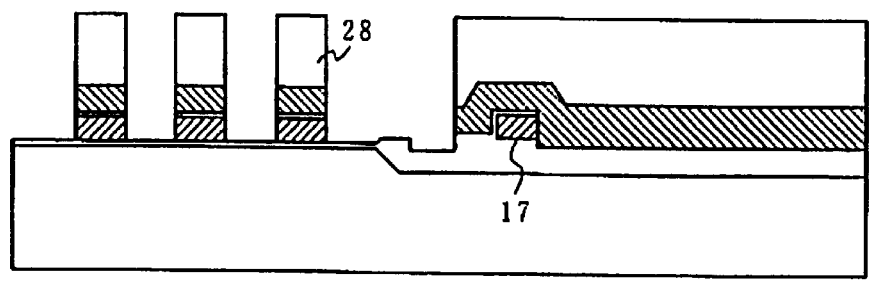

Next, resist pattern 21 is removed, and, as shown in FIG. 14C, FIG. 15C, and FIG. 16C, control gate electrodes 30 are formed by forming over the entire surface film 27, which has a two-layer structure in which the lower layer is polysilicon containing phosphorus and having a thickness of 500–1500 Å and the upper layer is refractory metal silicide having a thickness of 500–1500 Å, and then patterning only memory cell area using resist pattern 28.

Figure 14D:
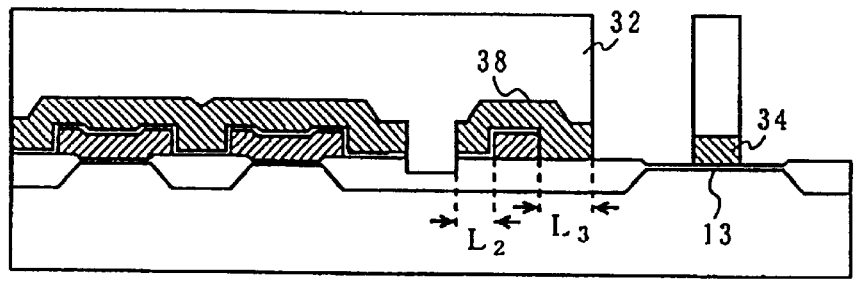
Figure 15D:
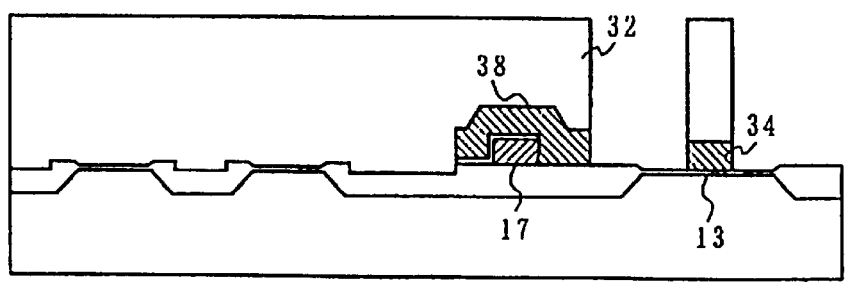
Figure 16D:
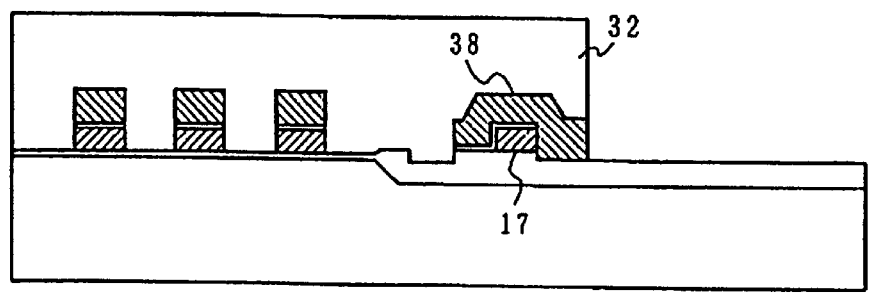

Next, resist pattern 28 is removed, and as shown in FIG. 14D, FIG. 15D, and FIG. 16D, gate electrodes 34 are formed by forming resist pattern 32 and patterning film 27 that is formed in the peripheral circuit area and that has a two-layer structure in which the lower layer is polysilicon and the upper layer is refractory metal silicide. At the same time, dummy pattern 38 that covers the portion of polysilicon 17 is patterned so as to surround the memory cell area in the boundary area. The widths $L_2$ and $L_3$ of the two sides of this dummy pattern 38 that enclose polysilicon 17 are each, for example, 0.3–0.6 μm. This dummy pattern is connected to GND when the memory device is used.

According to this second embodiment, ONO film 25 that is formed on the side walls of polysilicon 17 is buried inside dummy pattern 38 without being subjected to the etching removal process, and the problem of the first embodiment that is caused by residue of ONO film 25 in suspension therefore does not occur.

In addition, the control gate electrodes in the first embodiment and second embodiment may also be formed by polysilicon as in the fabrication method of the prior art.

According to the present invention, dry etching can be used when removing portions outside the memory cell area of the insulating film, which was formed over the entire surface to form the insulating film between the floating gate and control gate, because polysilicon is present at the lower surface of the insulating film. The presence of the polysilicon at the lower surface also eliminates the danger of etching the silicon substrate in the gate oxide film formation area even in the event of over-etching. The present invention therefore enables an improvement in product yield.

Further, the second embodiment can eliminate the occurrence of extraneous material due to residue of the ONO film.

It is to be understood, however, that although the characteristics of the present invention have been set forth in the foregoing description, the disclosure is illustrative only, and changes may be made in the arrangement of the parts within the scope of the appended claims.

What is claimed is:

1. A method of fabricating a nonvolatile semiconductor memory device that includes a memory cell area, a peripheral circuit area, and boundary areas between said memory cell area and said peripheral circuit area, said areas together comprise an entire surface of said device, the method comprising the steps of:

forming an element isolating area on a substrate;

forming a first gate insulating film on said substrate in element areas other than said element isolating area;

forming, over the entire surface, a first conductive material;

patterning said first conductive material to form floating gate electrodes in said memory cell area;

implanting ions to form a channel stopper;

forming, over the entire surface, an insulative material;

removing said insulative material and said first conductive material from areas other than said memory cell area by dry etching;

removing said first gate insulating film in areas other than said memory cell area by wet etching;

forming a second gate insulating film in said areas other than said memory cell area;

forming, over the entire surface, a second conductive material to form control gate electrodes of said nonvolatile memory;

patterning said second conductive material of said memory cell area to cover residue, said residue being said insulative material formed on side walls of said first conductive material of areas other than said memory cell area that remain after said dry etching and said wet etching; and patterning said second conductive material of said peripheral circuit area to form gate electrodes, leaving portions of said second conductive material that cover said residue in said boundary areas.

2. The method of fabricating a nonvolatile semiconductor memory device according to claim 1, wherein said insulative material is a film of three-layer structure composed of an oxide film, a nitride film, and an oxide film.

3. The method of fabricating a nonvolatile semiconductor memory device according to claim 1, wherein said first conductive material and said second conductive material are conductive polysilicon.

4. The method of fabricating a nonvolatile semiconductor device according to claim 1, wherein said first conductive material is conductive polysilicon and said second conductive material is a film of two-layer structure composed of a refractory metal silicide upper layer and a conductive polysilicon lower layer.

5. A method of fabricating a nonvolatile semiconductor memory device that includes a memory cell area, a peripheral circuit area, and boundary areas between said memory cell area and said peripheral circuit area, said areas together comprise an entire surface of said device, the method comprising the steps of:

forming an element isolating area on a substrate;

forming a first gate insulating film on said substrate in element areas other than said element isolating areas;

forming over the entire surface, a first conductive material;

patterning said first conductive material to form floating gate electrodes in said memory cell area;

implanting ions to form a channel stopper;

forming, over the entire surface, an insulative material;

removing said insulative material and said first conductive material from part of said boundary areas and from said peripheral circuit area and leaving said first conductive material and said insulative material overlying said first conductive material at a prescribed position of said boundary area;

removing said first gate insulating film in said peripheral circuit area by wet etching;

forming a second gate insulating film in said peripheral circuit area;

forming a second conductive material over the entire surface;

patterning said second conductive material of said memory cell area to form control gate electrodes; and patterning said second conductive material of said peripheral circuit area to form gate electrodes, said first conductive material that was left at said prescribed position of said boundary areas, said insulative material that overlies said first conductive material, and said second conductive material that covers said overlying insulative material being left on said boundary areas.

6. The method of fabricating a nonvolatile semiconductor memory device according to claim 5, wherein said insulative material is a film of three-layer structure composed of an oxide film, a nitride film, and an oxide film.

7. The method of fabricating a nonvolatile semiconductor memory device according to claim 5, wherein said first conductive material and said second conductive material are conductive polysilicon.

8. The method of fabricating a nonvolatile semiconductor memory device according to claim 5, wherein said first conductive material is conductive polyisilicon and said second conductive material is a film of two-layer structure composed of a refractory metal silicide upper layer and a conductive polysilicon lower layer.

* * * * *